(12) United States Patent
Tateshita

(10) Patent No.: US 10,950,418 B2
(45) Date of Patent: Mar. 16, 2021

(54) PLASMA PROCESSING APPARATUS AND PLASMA PROCESSING METHOD

(71) Applicant: TOKYO ELECTRON LIMITED, Tokyo (JP)

(72) Inventor: Koichi Tateshita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/694,088

(22) Filed: Nov. 25, 2019

(65) Prior Publication Data

US 2020/0168441 A1 May 28, 2020

(30) Foreign Application Priority Data

Nov. 27, 2018 (JP) .............................. JP2018-221304

(51) Int. Cl.
*H01J 37/32* (2006.01)
*H01L 21/67* (2006.01)

(52) U.S. Cl.
CPC .... *H01J 37/32522* (2013.01); *H01J 37/3244* (2013.01); *H01J 37/32467* (2013.01); *H01J 37/32477* (2013.01); *H01L 21/67069* (2013.01); *H01J 37/32724* (2013.01); *H01J 2237/20235* (2013.01); *H01J 2237/332* (2013.01); *H01J 2237/334* (2013.01)

(58) Field of Classification Search
CPC ........... H01J 37/32467; H01J 37/32477; H01J 37/32522; H01J 37/3244; H01J 2237/332; H01J 2237/20235; H01J 2237/334; H01J 37/32724; H01L 21/68742; H01L 21/67069

See application file for complete search history.

(56) References Cited

FOREIGN PATENT DOCUMENTS

JP H11-330058 A 11/1999

*Primary Examiner* — Yuechuan Yu
(74) *Attorney, Agent, or Firm* — Nath, Goldberg & Meyer; Jerald L. Meyer

(57) ABSTRACT

A plasma processing apparatus for performing a plasma processing on a substrate within a processing container includes: an upper electrode disposed above the processing container; a cylindrical shield member provided on the processing container to support a matching device; a power feeding rod disposed inward of the shield member and for supplying a high-frequency power provided from a plasma source to the upper electrode via the matching device; a gas introduction member for supplying a processing gas heated outside the shield member into the processing container from above the upper electrode; and a sealing member provided outside the shield member and on a peripheral edge of a penetration portion of the shield member through which the gas introduction member penetrates, the sealing member made of a conductive material having a lower thermal conductivity than materials of the gas introduction member and the shield member.

19 Claims, 2 Drawing Sheets

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2018-221304, filed on Nov. 27, 2018, the entire contents of which are incorporated herein by reference.

TECHNICAL FIELD

The present disclosure relates to a plasma processing apparatus and a plasma processing method.

BACKGROUND

Patent Document 1 discloses a plasma processing apparatus, in which a power feeding rod is provided to connect a matching device and an electrode disposed in a processing container, and a high-frequency power supplied via the matching device is applied to the electrode via the power feeding rod so as to perform a plasma processing on a workpiece disposed inside the processing container. The matching device is disposed on the processing container, and the power feeding rod is disposed on the central axis of the processing container.

PRIOR ART DOCUMENT

Patent Documents

Patent Document 1: Japanese Laid-Open Patent Publication No. H11-330058

SUMMARY

According to an embodiment of the present disclosure, there is provided a plasma processing apparatus for performing a plasma processing on a substrate within a processing container, including: an upper electrode disposed above the processing container; a cylindrical shield member provided on the processing container and configured to support a matching device; a power feeding rod disposed inward of the shield member and configured to supply a high-frequency power provided from a plasma source to the upper electrode via the matching device; a gas introduction member configured to supply a processing gas heated outside the shield member into the processing container from above the upper electrode; and a sealing member provided outside the shield member and on a peripheral edge of a penetration portion of the shield member through which the gas introduction member penetrates, the sealing member being made of a conductive material having a lower thermal conductivity than materials of the gas introduction member and the shield member; wherein the gas introduction member and the shield member are grounded to an earth.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
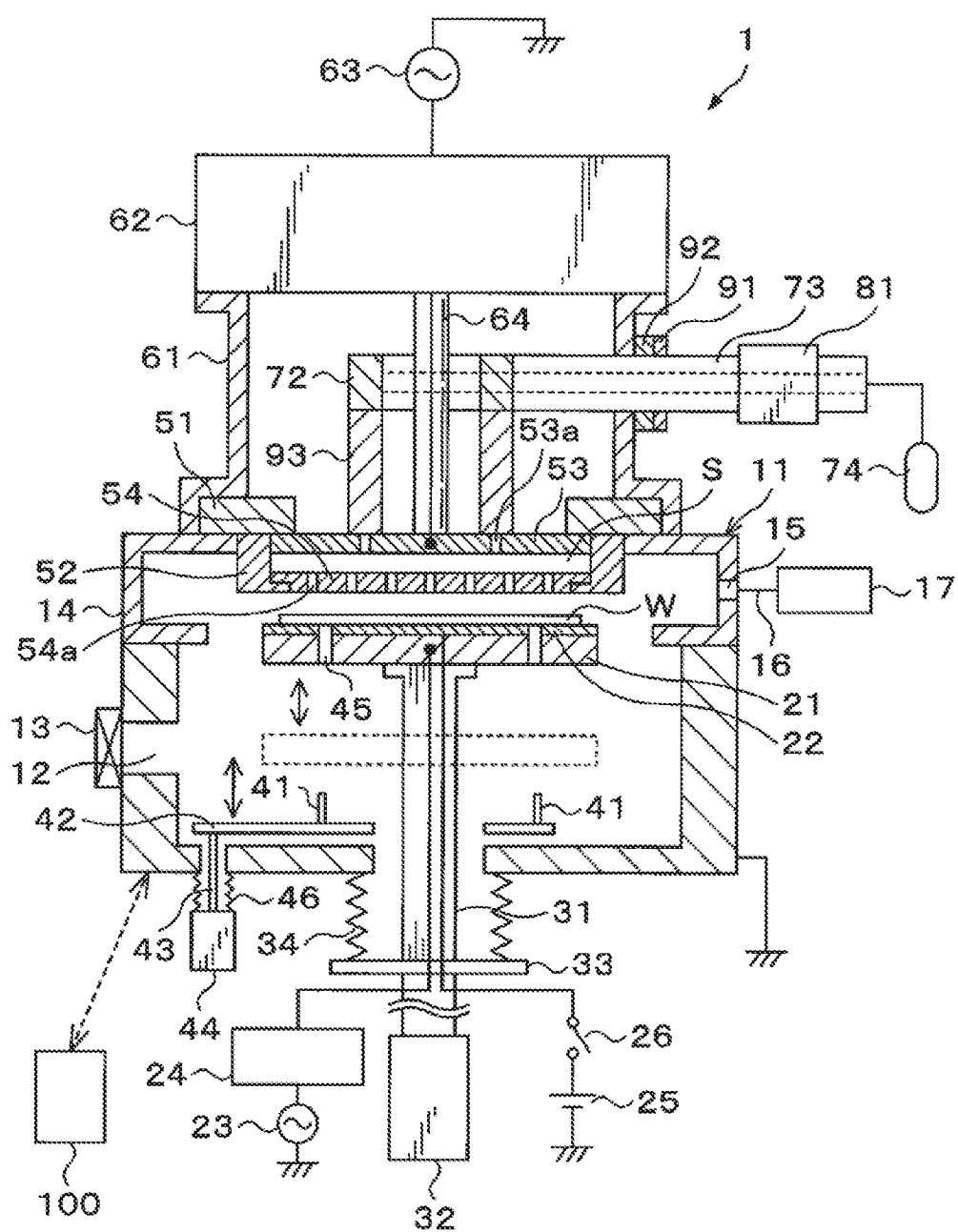
FIG. 1 is a vertical cross-sectional view for explaining a schematic configuration of a plasma processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a film-forming process using a plasma processing apparatus is performed on a semiconductor wafer (which may sometimes be referred to as a "wafer" hereinafter). In such a case, for example, a high-frequency power from a high-frequency power source is applied to an upper electrode inside the processing container through a matching device to generate plasma inside the processing container. Then, a processing gas heated to a predetermined temperature is introduced into the processing container, and a plasma processing is performed with respect to the wafer on a lower electrode inside the processing container.

In performing such a plasma processing, a high-frequency power supply having a frequency of 60.0 MHz is used, but in order to improve plasma uniformity and process performance and to apply the high-frequency power to the upper electrode at the shortest distance, in Patent Document 1, a power feeding rod is disposed on the central axis of the upper electrode. Therefore, the matching device is disposed above the processing container.

The processing gas used for the plasma processing is heated to a predetermined temperature, for example, about 100 degrees C., and introduced into the processing container. Thus, a gas introduction path connected to the processing container also becomes high in temperature. Then, high-temperature heat is radiated from the gas introduction path to the processing container, and ultimately to the matching device above the processing container. This type of matching device has an upper limit of use temperature of about 50 degrees C. Thus, if the above-mentioned high-temperature heat is radiated to the matching device, there is a possibility that the predetermined performance of the matching device may not be exhibited, and in some cases, the failure of the matching device may be caused.

Therefore, in the plasma processing apparatus in which the matching device is disposed above the processing container, there arises a problem on how to suppress the increase in temperature of the matching device in introducing the above-mentioned high temperature processing gas into the processing container. In addition, in the case of heating the processing gas, heating is performed outside the processing container. In introducing the heated processing gas into the processing container, it is necessary to pay attention to the leakage of high-frequency waves in a flow path for gas introduction and a connection portion to the processing container.

Therefore, the technique according to the present disclosure prevents the leakage of high-frequency waves while suppressing an increase in temperature of the matching device above the processing container in supplying a heated processing gas into the processing container in the plasma processing apparatus.

Hereinafter, the configuration of a plasma processing apparatus according to the present embodiment will be described with reference to the drawings. In this specification, elements having substantially the same functional configurations will be denoted by the same reference numerals and redundant descriptions thereof will be omitted.

FIG. 1 schematically illustrates the outline of the configuration of a plasma processing apparatus 1 as a plasma processing apparatus according to the present embodiment. The plasma processing apparatus 1 includes a processing container 11, which is a vacuum container for accommodating and processing a wafer W as a substrate. The processing container 11 is made of a conductive metal, for example, A5052, an aluminum-containing metal. The processing container 11 is grounded to the earth.

The plasma processing apparatus 1 is configured as an etching apparatus for removing, for example, a natural oxide film or a metal oxide film. According to this plasma processing apparatus 1, it is possible to perform etching processing using, for example, plasma, which is generated from a well-known processing gas, such as a halogen-containing gas, and an inert gas.

The processing container 11 is configured in a substantially flat cylindrical shape. A wafer loading/unloading port 12 is formed in a lower sidewall of the processing container 11. A gate valve 13 capable of opening/closing the loading/unloading port 12 is provided in the loading/unloading port 12. An exhaust duct 14 is provided above the loading/unloading port 12. The exhaust duct 14 constitutes a portion of the sidewall of the processing container 11 and is formed by bending a duct having a channel groove shape in a vertical section, in an annular shape. A slit-shaped exhaust port 15 extending in the circumferential direction is formed in an inner circumferential surface of the exhaust duct 14. One end of an exhaust pipe 16 is connected to the exhaust port 15. The other end of the exhaust pipe 16 is connected to an exhaust apparatus 17 including, for example, a vacuum pump.

A stage 21 having a circular shape in a plan view is provided inside the processing container 11. The wafer W is placed on the stage 21 in a horizontal posture. The stage 21 constitutes a lower electrode. An electrostatic chuck 22 is provided on an upper surface of the stage 21. A heater (not illustrated) is provided inside the stage 21 in order to heat the wafer W.

A high-frequency power for bias, for example, a high-frequency power of 13.56 MHz is supplied to the stage 21 from a high-frequency power supply 23 provided outside the processing container 11 via a matching device 24. A DC voltage is applied to the electrostatic chuck 22 from a DC power supply 25 provided outside the processing container 11. ON/OFF of the DC voltage is performed by a switch 26.

An upper end portion of a support member 31 that extends in the vertical direction through a bottom portion of the processing container 11 is connected to a lower central portion of the stage 21. A lower end portion of the support member 31 is connected to a lifting mechanism 32. By driving the lifting mechanism 32, the stage 21 is movable up and down between a lower position indicated by a broken line in FIG. 1 and an upper position indicated by a solid line in FIG. 1. The lower position of the stage 21 is a delivery position at which the wafer W which enters into the processing container 11 from the above-mentioned loading/unloading port 12 by a wafer transfer mechanism (not illustrated) is delivered on the stage 21. In addition, the upper position is a processing position where the processing is performed on the wafer W.

On the support member 31, a flange 33 is provided outside the processing container 11. In addition, a bellows 34 is provided between the flange 33 and a penetration portion formed in the bottom portion of the processing container 11 and through which the support member 31 penetrates, so as to surround an outer periphery of the support member 31. As a result, the airtightness of the processing container 11 is maintained.

A wafer lifting member 42 having a plurality of (e.g., three) support pins 41 is disposed in an inner lower portion of the processing container 11. A support column 43 is provided on a lower surface of the wafer lifting member 42. The support column 43 penetrates the bottom portion of the processing container 11 and is connected to a lifting mechanism 44 provided outside the processing container 11. Accordingly, the wafer lifting member 42 is movable up and down by driving the lifting mechanism 44.

When the stage 21 is at the delivery position, by raising the wafer lifting member 42, the support pins 41 are movable upward and downward on the stage 21 and the electrostatic chuck 22 via respective through-holes 45 formed in the stage 21 and the electrostatic chuck 22. With this configuration, it is possible to place the wafer W on the support pins 41. In that state, it is possible to delivery of the wafer W between the support pins 41 and a transfer mechanism (not illustrated), such as a transfer arm.

A bellows 46 is provided between the lifting mechanism 44 and a penetration portion through which the support column 43 penetrates in the bottom portion of the processing container 11 so as to surround an outer periphery of the support column 43. As a result, the airtightness of the processing container 11 is maintained.

An annular insulation support member 51 is provided on the exhaust duct 14. An electrode support member 52 made of quartz is provided on a lower surface of the insulation support member 51. A disc-shaped upper electrode 53 is provided in the electrode support member 52. Below the upper electrode 53, a shower plate 54 is provided in parallel with the upper electrode 53 with a space S interposed between the shower plate 54 and the upper electrode 53. A plurality of through-holes 53a is formed in the upper electrode 53, and a plurality of ejection holes 54a is formed in the shower plate 54.

A cylindrical shield member 61 is provided on the exhaust duct 14. The shield member 61 is made of a conductive metal, for example, A5052, an aluminum-containing metal, and is electrically connected to the processing container 11 via the exhaust duct 14. That is, the shield member 61 is grounded to the earth. The shield member 61 prevents the leakage of high-frequency waves. The shield member 61 and the upper side of the exhaust duct 14 are connected to each other in a spiral manner to enhance electrical conduction.

A matching device 62 is supported on the shield member 61. High-frequency power from a high-frequency power supply 63 serving as a power source for plasma generation is supplied to a power feeding rod 64 disposed on a lower surface of the matching device 62 via the matching device 62. The power feeding rod 64 is connected to the center of the upper electrode 53. Therefore, the high-frequency power from the high-frequency power supply 63 is supplied to the central portion of the upper electrode 53 via the matching device 62.

Figure 2:
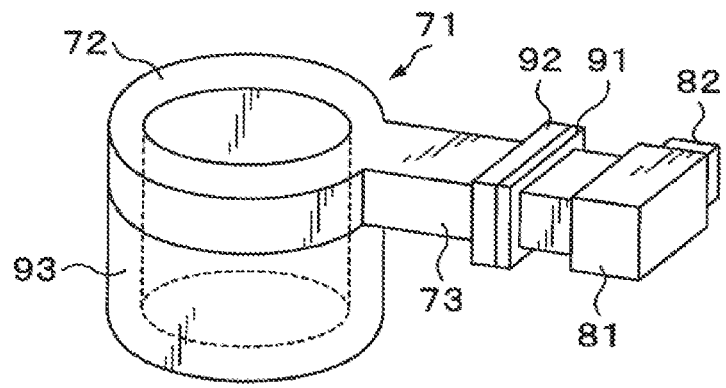
FIG. 2 is a perspective view of a gas introduction member in the plasma processing apparatus of FIG. 1.

An inlet block 71 as a gas introduction member is provided inside the shield member 61. As illustrated in FIG. 2, the inlet block 71 includes an annular portion 72 and a rectangular tube-shaped introduction portion 73 having one end connected to the annular portion 72. The inlet block 71 is made of a conductive metal, for example, A5052, an aluminum-containing metal.

Figure 3:
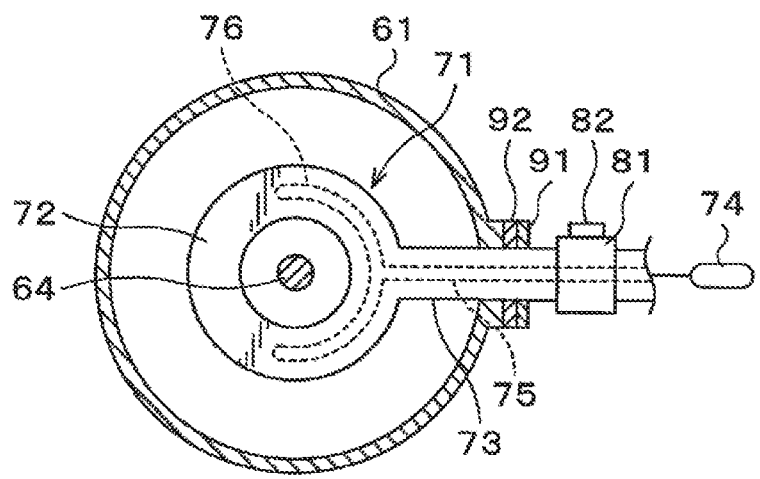
FIG. 3 is a plan view for explaining the gas introduction member in the plasma processing apparatus of FIG. 1.

As illustrated in FIGS. 1 and 3, the annular portion 72 is disposed such that the power feeding rod 64 is located in the central portion of the annular portion 72, and has a size that forms a predetermined distance between an inner circumferential surface of the annular portion 72 and an outer circumferential surface of the power feeding rod 64.

The other end of the introduction portion 73 of the inlet block 71 is connected to a source 74 of the aforementioned processing gas. As illustrated in FIG. 3, processing gas flow paths 75 and 76 are formed to be in communication with each other inside the annular portion 72 and the introduction portion 73. As illustrated in FIG. 3, the flow path 76 inside the annular portion 72 is branched into two flow paths along the annular portion 72 from the flow path 75 so as to have a semi-circular arc shape.

A heating part 81 is provided outside the shield member 61 in the introduction portion 73 of the inlet block 71. A heater 82 for heating the processing gas is provided in the healing part 81. By the heater 82, the processing gas from the source 74 is heated to a predetermined temperature of, for example, 100 degrees or higher.

A flange portion 91 is provided outside the shield member 61 in the introduction portion 73 of the inlet block 71 and in the vicinity of the penetration portion the shield member 61 through which the introduction portion 73 penetrates in the shield member 61, The material of the flange portion 91 is the same as that of the introduction portion 73 of the inlet block 71, for example, the aluminum-containing metal A5052. A rectangular frame-shaped sealing member 92, which conforms to the outer shape of the introduction portion 73, is provided between the flange portion 91 and a wall surface of the penetration portion of the shield member 61. That is, the sealing member 92 is sandwiched between the wall of the shield member 61 and the flange portion 91 to seal the penetration portion.

The material of the sealing member 92 is conductive and has a lower thermal conductivity than materials of the introduction portion 73, the flange portion 91, and the shield member 61. In the present embodiment, stainless steel SUS304 is used as the material of the sealing member 92.

As illustrated in FIGS. 1 and 2, below the annular portion 72 of the inlet block 71, a cylindrical insulation introduction member 93 having the same inner and outer diameter as those of the annular portion 72 is disposed between the annular portion 72 and the upper electrode 53. The insulation introduction member 93 is made of an insulating material. A gas flow path (not shown) communicating with the flow path 76 of the annular portion 72 is formed inside the insulation introduction member 93. The gas flow path communicates with the through-holes 53a of the upper electrode 53. Accordingly, the processing gas from the source 74 is supplied into the space S between the upper electrode 53 and the shower plate 54 through each gas flow path in the introduction portion 73, the annular portion 72, and the insulation introduction member 93. Then, the processing gas in the space S is formed into a plasma inside the space S and is uniformly supplied toward the wafer W on the stage 21 through the ejection holes 54a of the shower plate 54.

In the plasma processing apparatus 1 having the above-described configuration, each operation is controlled by a controller 100. That is, the controller 100 may be a computer, and has a program storage part (not illustrated). The program storage part stores a program necessary for implementing a plasma-based process by performing various processes of the wafer W in the plasma processing apparatus 1, for example, the supply and cutoff, and heating of the processing gas, the raising/lowering operation of the stage 21, the operation of the electrostatic chuck 22, the raising/Lowering operation of the wafer lifting member 42, ON-OFF operation and output control of the high-frequency power supplies 23 and 63, and the like. The program may be recorded in a non-transitory computer-readable storage medium, and may be installed on the controller 100 from the storage medium.

The plasma processing apparatus 1 according to the embodiment has the above-described configuration, and the operation, action and effect thereof will be described hereinafter.

The gate valve 13 is opened in the state in which the interior of the processing container 11 is in a predetermined vacuum atmosphere. The wafer W is transferred from a vacuum transfer chamber (not illustrated) adjacent to the processing container 11 onto the stage 21 located at the delivery position by a transfer mechanism (not illustrated). Subsequently, the wafer W is delivered on the raised support pins 41. The transfer mechanism is withdrawn backward from the processing container 11, and the gate valve 13 is closed. At the same time, the support pins 41 are lowered so that the wafer W is placed on the stage 21. Then, the water W is attracted by the electrostatic chuck 22 of the stage 21. The wafer W is heated to a predetermined temperature by a heater (not illustrated) of the stage 21.

Thereafter, the high-frequency power supplies 23 and 63 are operated, and the heated processing gas is introduced from the inlet block 71 and supplied onto the wafer W, whereby a natural film, a metal oxide film, or the like formed on the front surface of the wafer W is removed by the plasma-based process, for example, an etching process.

In the film-forming process described above, the processing gas is heated by the heating part 81 to a predetermined temperature, for example, 100 degrees C. or higher. Heat generated at that time tends to be radiated from the shield member 61 to the matching device 62 via the introduction portion 73.

However, in the plasma processing apparatus 1 according to the present embodiment, since the sealing member 92 having a lower thermal conductivity than materials of the introduction portion 73 and the shield member 61 is provided on the peripheral edge of the penetration portion through which the introduction portion 73 penetrates in the shield member 61, the radiation of heat to the matching device 62 is suppressed. Accordingly, it is possible to suppress the increase in temperature of the matching device 62 compared with the related art. In addition, it is possible to suppress the radiant heat from the heating part 81 via the flange portion 91 and the sealing member 92. Thus, it is possible to suppress the increase in temperature of the matching device 62 at this point.

However, when performing the plasma-based process by the high-frequency power described above, it is necessary to prevent the high-frequency waves emitted from the power feeding rod 64 from leaking to the surroundings.

In this regard, in the plasma processing apparatus 1 according to the embodiment, since the sealing member 92 is provided on the peripheral edge of the penetration portion through which the introduction portion 73 penetrates in the shield member 61, it is possible to prevent high-frequency waves from leaking from the penetration portion through a minute gap generated in the penetration portion. Therefore, with the plasma processing apparatus 1 according to the embodiment, it is possible to suppress the increase in temperature of the matching device 62 due to the heating of the processing gas, and prevent the leakage of the high-frequency waves.

More specifically, there is a possibility that a minute gap may be generated in the penetration portion through which the introduction portion 73 of the inlet block 71 penetrates in the shield member 61, due to the influence of machining accuracy or the like. When this gap is left as it is, high-frequency waves may leak from the gap. Therefore, it is necessary to seal the gap with any conductive member. However, when the sealing member is made of the same material as those of the introduction portion 73 and the shield member 61, the shielding effect may be obtained, but the heat is radiated to the matching device 62 as it is via the shield member 61.

In this regard, in the embodiment, a material (stainless steel SUS304), which is conductive but has a lower thermal conductivity than materials of the introduction portion 73 and the shield member 61 is used for the sealing member 92. Thus, the conduction of heat to the shield member 61 is suppressed while the shielding effect is exhibited. As a result, it is possible to prevent the leakage of high-frequency waves while ensuring the proper operation of the snatching device 62.

In order to further suppress the conduction of heat from the introduction portion 73 to the matching device 62 via the shield member 61, the sealing member 92 may have a so-called socket shape. That is, by forming a shape that covers the outer periphery of the introduction portion 73 and has a convex portion that enters the penetration portion of the shield member 61, a portion at which the introduction portion 73 and the shield member 6 are in direct contact with each other may be eliminated. With this configuration, is possible to further suppress the conduction of heat from the introduction portion 73 to the shield member 61.

In the embodiment described above, the inner diameter of the annular portion 72 of the inlet block 71 is set to have a distance from the outer periphery of the power feeding rod 64. Thus, an appropriate insulation effect is obtained according to the distance. Accordingly, it is not necessary to coat the outer periphery of the power feeding rod with an insulating member such as PTFE, which has been conventionally used in this type cif apparatus. Therefore, according to the embodiment described above, it is possible to reduce an electrical loss compared to the related art, and thus the efficiency of input electric power is good.

In the above-described embodiment, high-frequency waves emitted from the periphery of the power feeding rod 64 are received and shielded by the annular portion 72 connected to the grounded introduction portion 73 in the upper portion of the power feeding rod 64. In some embodiments, from the viewpoint of enhancing a grounding efficiency and further improving the uniformity of the shielding effect, a configuration as illustrated in FIG. 4 may be employed.

Figure 4:
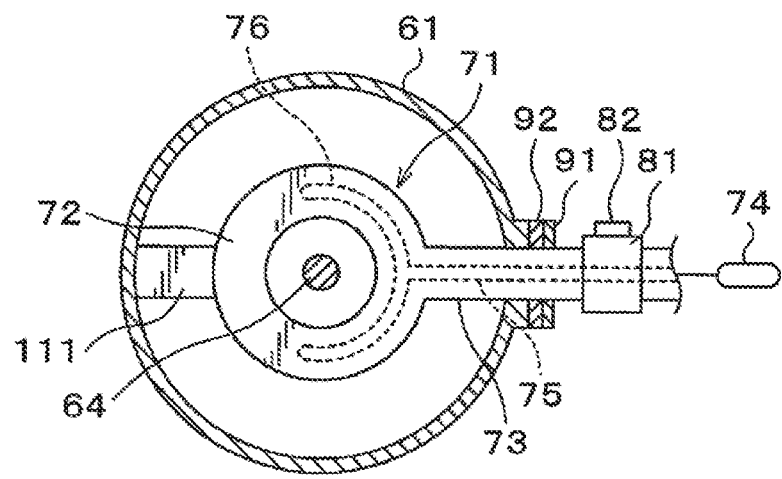
FIG. 4 is an explanatory plane view of another gas introduction member that is capable of being used in the plasma processing apparatus of FIG. 1.

That is, in the example illustrated in FIG. 4, a ground plate 111 grounded to the earth is provided at a position opposite the introduction portion 73 in the radial direction between the annular portion 72 of the inlet block 71 and the shield member 61. As a result, the high frequency waves received by the annular portion 72 may also be released from the position symmetrical to the introduction portion 73. Therefore, it is possible to enhance a grounding efficiency, and to suppress the flow of the high-frequency waves to the ground portion from being biased, thereby improving the uniformity of processing.

The present disclosure is not limited to the above configuration. In some embodiments, a plurality of ground plates 111 may be connected radially between the shield member 61 and the annular portion 72 at regular intervals. As a result, it is possible to more uniformly release the high-frequency waves from the power feeding rod 64, thus further improving the processing uniformity.

In addition, although the plasma processing apparatus have been described in the above embodiments, the technology according to the present disclosure may be embodied as another plasma processing apparatus, for example, a plasma film-forming apparatus.

It should be noted that the embodiments disclosed herein are exemplary in all respects and are not restrictive. The above-described embodiments may be omitted, replaced or modified in various forms without departing from the scope and spirit of the appended claims.

The following configurations also belong to the technical scope of the present disclosure.

(1) A plasma processing apparatus for performing a plasma processing on a substrate within a processing container, includes: an upper electrode disposed above the processing container; a cylindrical shield member provided on the processing container and configured to support a matching device; a power feeding rod disposed inward of the shield member and configured to supply a high-frequency power provided from a plasma source to the upper electrode via the matching device; a gas introduction member configured to supply a processing gas heated outside the shield member into the processing container from above the upper electrode; and a sealing member provided outside the shield member and on a peripheral edge of a penetration portion of the shield member through which the gas introduction member penetrates, the sealing member being made of a conductive material having a lower thermal conductivity than materials of the gas introduction member and the shield member, wherein the gas introduction member and the shield member are grounded to an earth.

(2) In the plasma processing apparatus described in item (1), the gas introduction member includes a flange portion provided on an outer periphery of the gas introduction member outside the shield member, and the sealing member is sandwiched between a wall of the shield member and the flange portion.

(3) In the plasma processing apparatus described in item (1) or (2), the gas introduction member includes an annular portion provided inside the shield member, the annular portion having a gas flow path formed therein and a shape that surrounds the power feeding rod.

(4) The plasma processing apparatus described in item (3) further includes at least one ground member provided between the annular portion and the shield member.

(5) In the plasma processing apparatus described in any one of items (1) to (4), the heated processing gas has a temperature of 100 degrees C. or higher.

(6) In the plasma processing apparatus described in any one of items (5), the gas introduction member and the shield member are made of a same material.

(7) In the plasma processing apparatus described in any one of items (1) to (6), the gas introduction member and the shield member are made of an aluminum-containing metal.

(8) In the plasma processing apparatus described in item (7), the aluminum-containing metal is A5052.

(9) In the plasma processing apparatus described in any one of items (1) to (8), the sealing member is made of a stainless steel.

(10) In the plasma processing apparatus described in item (9), the stainless steel is SUS304.

(11) A plasma processing method performs a plasma processing on a substrate within the processing container using the plasma processing apparatus described in any one of items (1) to (10).

With the technique according to the present disclosure, it is possible to suppress an increase in temperature of a matching device disposed above a processing container in heating a processing gas and supplying the heated processing gas into the processing container using the plasma processing apparatus.

What is claimed is:

1. A plasma processing apparatus for performing a plasma processing on a substrate within a processing container, comprising:
    an upper electrode disposed above the processing container;
    a cylindrical shield member provided on the processing container and configured to support a matching device;
    a power feeding rod disposed inward of the shield member and configured to supply a high-frequency power provided from a plasma source to the upper electrode via the matching device;
    a gas introduction member configured to supply a processing gas heated outside the shield member into the processing container from above the upper electrode; and
    a sealing member provided outside the shield member and on a peripheral edge of a penetration portion of the shield member through which the gas introduction met her penetrates, the sealing member being made of a conductive material having a lower thermal conductivity than materials of the gas introduction member and the shield member,
    wherein the gas introduction member and the shield member are grounded to an earth.

2. The plasma processing apparatus of claim 1, wherein the gas introduction member includes a flange portion provided on an outer periphery of the gas introduction member outside the shield member, and
    the sealing member is sandwiched between a wall of the shield member and the flange portion.

3. The plasma processing apparatus of claim 2, wherein the gas introduction member includes an annular portion provided inside the shield member, the annular portion having a gas flow path formed therein and a shape that surrounds the power feeding rod.

4. The plasma processing apparatus of claim 3, further comprising: at least one ground member provided between the annular portion and the shield member.

5. The plasma processing apparatus of claim 4, wherein the heated processing gas has a temperature of 100 degrees C. or higher.

6. The plasma processing apparatus of claim 5, wherein the gas introduction member and the shield member are made of a same material.

7. The plasma processing apparatus of claim 6, wherein the gas introduction member and the shield member are made of an aluminum-containing metal.

8. The plasma processing apparatus of claim 7, wherein the aluminum-containing metal is A5052.

9. The plasma processing apparatus of claim 8, wherein the sealing member is made of a stainless steel.

10. The plasma processing apparatus of claim 9, wherein the stainless steel is SUS304.

11. The plasma processing apparatus of claim 1, wherein the gas introduction member includes an annular portion provided inside the shield member, the annular portion having a gas flow path formed therein and a shape that surrounds the power feeding rod.

12. The plasma processing apparatus of claim 11, further comprising: at least one ground member provided between the annular portion and the shield member.

13. The plasma processing apparatus of claim 1, wherein the heated processing gas has a temperature of 100 degrees C. or higher.

14. The plasma processing apparatus of claim 1, wherein the gas introduction member and the shield member are made of a same material.

15. The plasma processing apparatus of claim 1, wherein the gas introduction member and the shield member are made of an aluminum-containing metal.

16. The plasma processing apparatus of claim 15, wherein the aluminum-containing metal is A5052.

17. The plasma processing apparatus of claim 1, wherein the sealing member is made of a stainless steel.

18. The plasma processing apparatus of claim 15, wherein the stainless steel is SUS304.

19. A method of performing the plasma processing on the substrate within the processing container using the plasma processing apparatus of claim 1.

* * * * *